(12) United States Patent
Devin

(10) Patent No.: US 6,411,544 B1
(45) Date of Patent: Jun. 25, 2002

(54) CIRCUIT FOR DETECTING AND RECORDING A VOLTAGE SURGE

(75) Inventor: Jean Devin, Le Tholonet (FR)

(73) Assignee: STMicroelectronics S.A., Gentilly (FR)

( * ) Notice: Subject to any disclaimer, the term of this patent is extended or adjusted under 35 U.S.C. 154(b) by 111 days.

(21) Appl. No.: 09/590,151

(22) Filed: Jun. 8, 2000

(30) Foreign Application Priority Data

Jun. 8, 1999 (FR) ............................................ 99 07458

(51) Int. Cl.[7] ............................................... G11C 16/04
(52) U.S. Cl. .............. 365/185.01; 365/226; 365/189.08
(58) Field of Search ........................... 365/185.01, 226, 365/189.08

(56) References Cited

U.S. PATENT DOCUMENTS

| 5,063,304 A | * | 11/1991 | Iyengar | 307/296.6 |
| 5,156,928 A | * | 10/1992 | Takabayashi | 429/23 |
| 5,428,252 A | | 6/1995 | Walker et al. | 307/64 |
| 5,629,890 A | * | 5/1997 | Engh | 365/185.03 |
| 5,761,117 A | * | 6/1998 | Uchino et al. | 365/185.03 |
| 5,896,324 A | | 4/1999 | Jang et al. | 365/189.07 |
| 5,943,263 A | * | 8/1999 | Rooharvar | 365/185.18 |
| 6,060,896 A | * | 5/2000 | Ma et al. | 324/763 |

FOREIGN PATENT DOCUMENTS

| EP | 0768675 | 4/1997 | ........... G11C/29/00 |
| EP | 0788116 | 8/1997 | ........... G11C/29/00 |

OTHER PUBLICATIONS

Patent Abstract of Japan. "Nonvolatile Memory" Publication No. 05325580. Publication Date Dec. 10, 1993.
Bursky, Dave. "Flash EEPROM Takes Changes in Place by Cutting Programming Signal to 5 V" Electronic Design, Nov. 1989, p. 30.

* cited by examiner

*Primary Examiner*—Richard Elms
*Assistant Examiner*—Tuan T. Nguyen
(74) *Attorney, Agent, or Firm*—Lisa K. Jorgenson; Allen, Dyer, Doppelt, Milbrath & Gilchrist, P.A.

(57) ABSTRACT

A circuit to detect and record the occurrence of a surge in the supply voltage applied to an integrated circuit includes a detection circuit for providing a control signal if a voltage surge is detected. The circuit also includes a high voltage circuit, which produces a high programming voltage from the supply voltage if a voltage surge is detected, and a memory cell. The detection circuit may include a capacitor divider bridge, a voltage source, and a comparator. The circuit is particularly advantageous for use with electrically programmable memories.

34 Claims, 2 Drawing Sheets

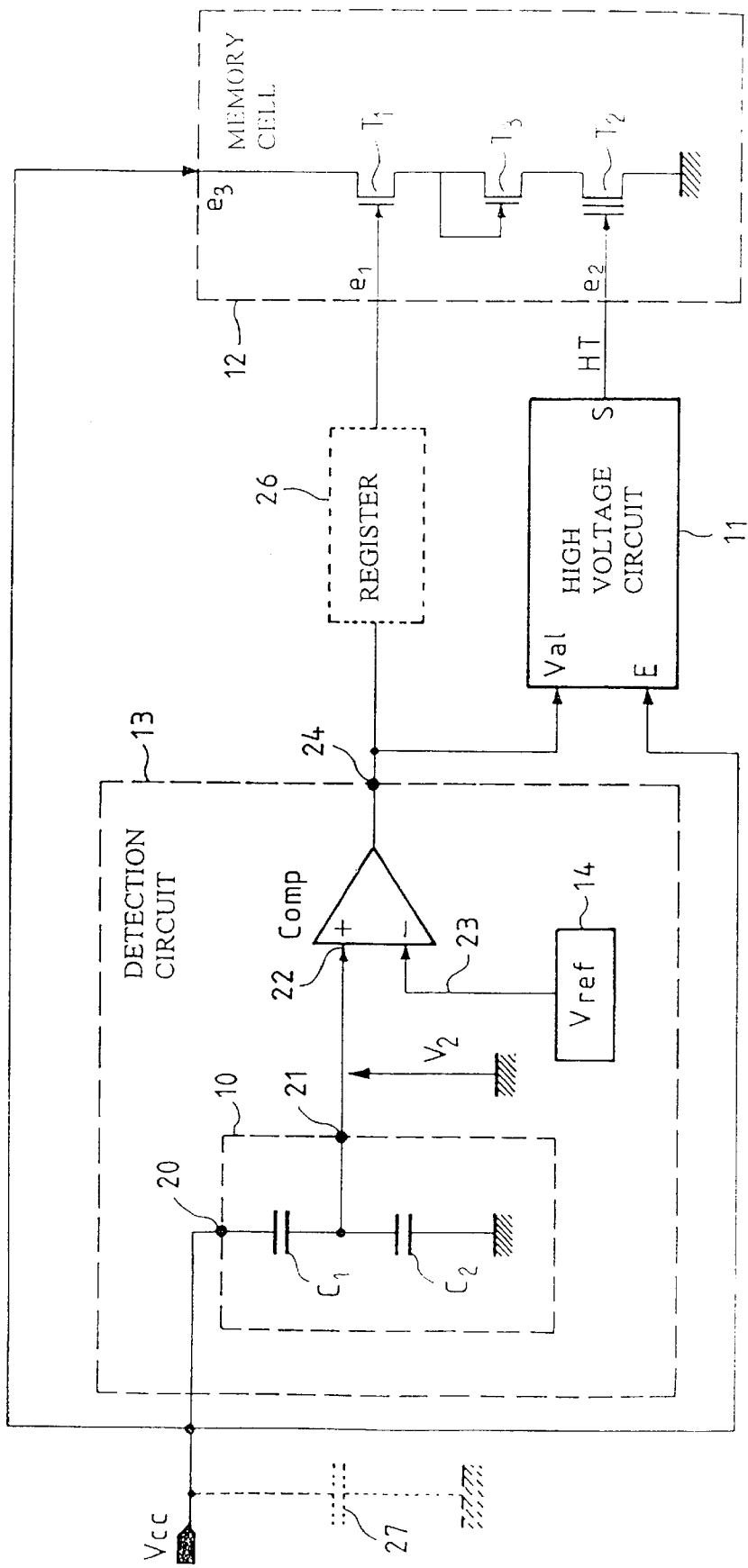
FIG_1

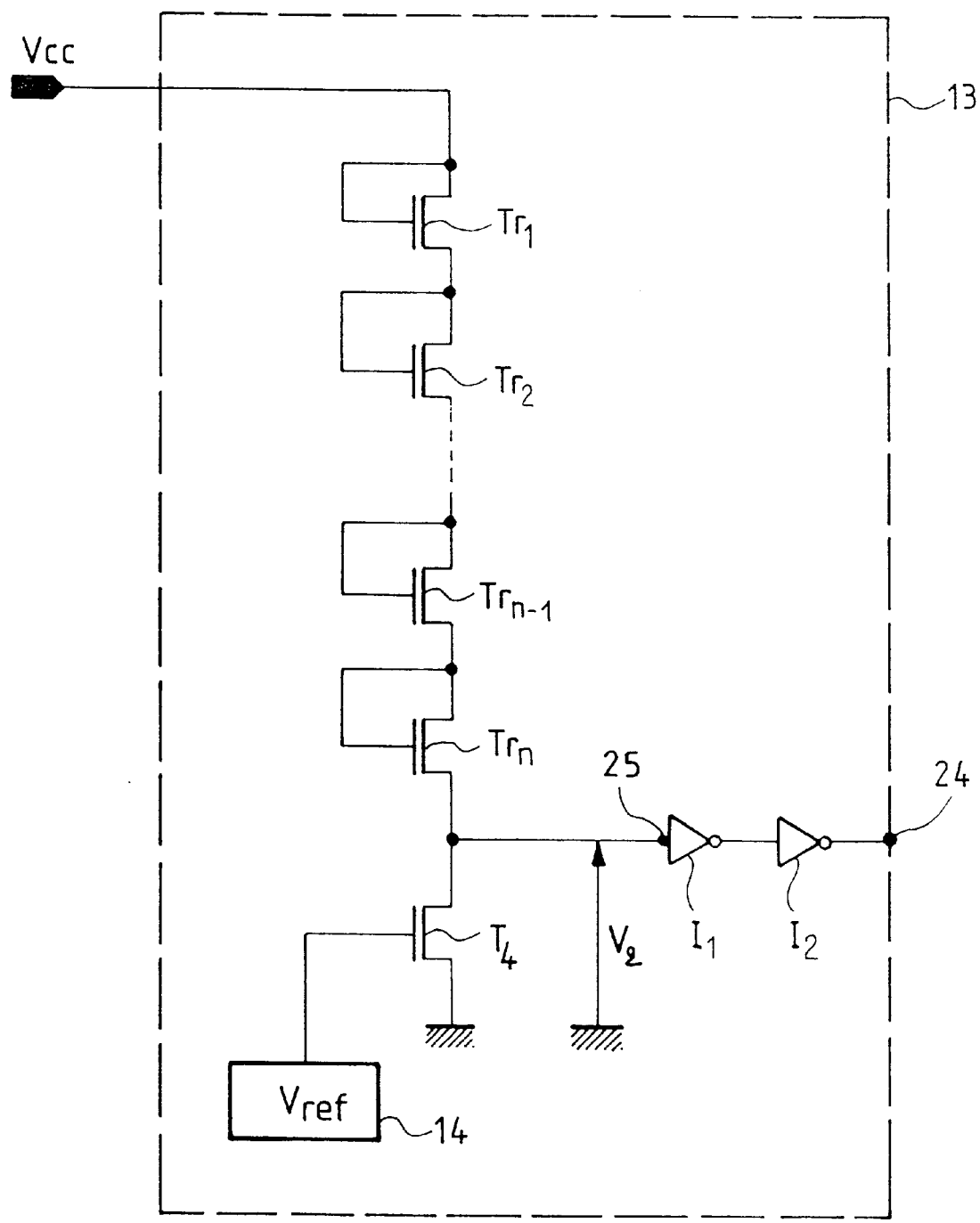
FIG_2

CIRCUIT FOR DETECTING AND RECORDING A VOLTAGE SURGE

FIELD OF THE INVENTION

The present invention relates to digital memory devices, and, more particularly, to electrically programmable non-volatile memories.

BACKGROUND OF THE INVENTION

In electrically programmable non-volatile memories, high voltages of about 10 to 20V are typically used to program or erase the memories. During programming or erasing, charge is stored or removed, respectively, from the floating gate of a floating gate transistor, which is the basic element of non-volatile memories.

External power supply circuits seldom provide such a high voltage. In particular, for embedded applications where the non-volatile memories are used in integrated circuits (e.g., smart cards), such a high voltage must necessarily be produced inside the memory. In most cases, this high voltage is provided by a low voltage supply using a voltage booster circuit of the charge pump type, for example. A charge pump typically includes capacitors, transistors and/or diodes. The charge pump is a fragile element in non-volatile memories. Indeed, the capacitors in such memories cannot withstand excessively high or long voltage surges in the power supply.

A non-volatile memory may undergo a voltage surge during use. That is, the low voltage supply of the memory may reach a value that is higher than a maximum value that the memory can withstand. A surge in the power supply voltage can damage or even destroy the charge pump of a memory and thus make it unusable. To limit the risks of destruction of the charge pump by excessively high power supply voltages, voltage limiter devices may be used. Voltage limiter devices limit the value of the supply voltage provided at the output of the charge pump.

Voltage limiters are not always sufficient to protect the memory because they may not limit the voltage at all points of the charge pump. A voltage surge may thus appear at a node of the charge pump without being visible at the output of the charge pump, and thus without being taken into account by the voltage limiter device. Moreover, the response time of voltage limiter devices is sometimes too long to avoid a surge in the supply voltage.

Accordingly, even with a voltage limiter device, a memory may still be subject to a voltage surge. As a result, manufacturers sometimes find that components coming off a production line are systematically rejected during a test procedure. To determine why the components have been rejected and to find a way to remedy this problem, it is often necessary to perform a complete analysis of the production line and, potentially, of the design of the product. This analysis may be very cumbersome if the cause of the problem is unknown. Similarly, users sometimes find that certain components wear out prematurely, and they are not able to easily ascertain the cause or a way to remedy it.

SUMMARY OF THE INVENTION

One object of the present invention is to provide a circuit to detect and record a voltage surge, particularly in electrically programmable non-volatile memories.

Another object of the present invention is to provide such a circuit that mitigates the above diagnostic difficulties.

These and other objects, features, and advantages are provided by a circuit for detecting and recording a voltage surge. The circuit includes a detection circuit to detect a voltage surge having a value higher than a maximum permissible value of a supply voltage provided by a power supply. The detection circuit provides a control signal if the voltage surge is detected. A high voltage circuit is also included to produce a high programming voltage from the power supply voltage, the high voltage circuit receiving the power supply voltage at a power supply input terminal and the control signal at an enabling input terminal. The circuit further includes a memory cell comprising an enabling input terminal to receive the control signal, a high voltage input terminal to receive the high voltage, and a low voltage input terminal to receive the power supply voltage.

The circuit may therefore be used to detect the occurrence of the voltage surge and then record this event in the memory cell, which is reserved for this purpose. The contents of the memory cell may also be read and used as an indicator, if necessary. The invention is well suited for non-volatile memories because suitable memory cells for use in the circuit are already available in such memories, making its implementation simple and inexpensive. Even so, the invention may also be used for other types of integrated circuits.

The detection circuit may include a capacitor divider bridge to provide a voltage that is proportional to the power supply voltage, a voltage source to provide a reference voltage, and a comparator receiving the voltage from the capacitor divider bridge at a first input terminal and the reference voltage at a second input terminal. The capacitor divider bridge may include two series-connected capacitors. Very little power is consumed in such an embodiment, making it particularly advantageous in applications such as integrated circuits for smart cards.

BRIEF DESCRIPTION OF THE DRAWINGS

The invention will be understood more clearly, and further characteristics and advantages will be understood, from the following description made with reference to the appended figures.

FIG. 1 is a schematic diagram of a circuit for detecting and recording a voltage surge according to the invention.

FIG. 2 is a schematic diagram of an alternative embodiment of one element of the circuit of FIG. 1.

DETAILED DESCRIPTION OF THE PREFERRED EMBODIMENTS

Turning now to FIG. 1, a circuit for detecting and recording a voltage surge is now described. The circuit includes a detection circuit 13, a high voltage circuit 11, and a memory cell 12. The detection circuit 13 includes a capacitor divider bridge 10, a voltage source 14, and a comparator Comp. The capacitor divider bridge 10 has an input terminal 20 connected to a power supply source providing a power supply voltage $V_{cc}$, and an output terminal 21 connected to an input terminal 22 (illustratively a positive (+) terminal) of the comparator Comp.

The capacitor divider bridge 10 may include two series-connected capacitors $C_1$, $C_2$. One of the terminals of the capacitor $C_1$ is connected to the input terminal 20, and one of the terminals of the capacitor $C_2$ is connected to ground. A common point of the capacitors $C_1$, $C_2$ is connected to the output terminal 21. The potential at output terminal 21 is a value $V_2$, where $V_2 = V_{cc} * C_1/(C_1+C_2)$, and the voltage $V_2$ is proportional to the power supply voltage $V_{cc}$.

The voltage source 14 provides a reference voltage $V_{ref}$ that is applied to an input terminal 23 (illustratively a negative (−) terminal) of the comparator Comp. The voltage source 14 may be obtained, for example, by using one or more Zener diodes, or by using one or more bipolar transistors. The latter structure is known as a "Bandgap Voltage Reference." A reference voltage source of this kind should be temperature stable.

An output terminal 24 of the comparator Comp is connected to the output of the detection circuit 13. The output of the comparator Comp is a steady state signal when the voltage $V_2$ is higher than the reference voltage $V_{ref}$. A high voltage circuit 11 includes a power supply input terminal E connected to the power supply source, an enabling input terminal Val connected to the output terminal 24 of the detection circuit 13, and an output terminal S that provides a high voltage HT to the memory cell 12.

The memory cell 12 includes an enabling input terminal $e_1$ connected to the output terminal 24 of the detection circuit 13, a high voltage input terminal $e_2$ connected to the output terminal S of the high voltage circuit 11, and a low voltage input terminal $e_3$ connected to the power supply source. The enabling input terminal $e_1$ is connected to the gate of a selection transistor $T_1$ having a drain connected to the low voltage input terminal $e_3$. A source of the selection transistor $T_1$ is connected to a drain of a floating gate storage transistor $T_2$ by a transistor $T_3$, whose drain is connected to its gate to form a diode. A gate of the storage transistor $T_2$ is connected to the high voltage input terminal $e_2$ and its source is connected to ground.

The above circuit for detecting and recording a voltage surge works as follows. To avoid damaging the detection and recording circuit, the supply voltage $V_{cc}$ should not exceed an acceptable maximum value $V_{ccmax}$. For example, for a circuit whose normal supply voltage $V_{cc}$ is about 5V, an acceptable maximum value $V_{ccmax}$ is about 8V. A voltage source 14 made with band gap voltage reference bipolar transistors gives a reference voltage $V_{ref}$ of about 1.2V. The two capacitors $C_1$, $C_2$ are adjusted so that the supply voltage $V_{ccmax}$ has a corresponding voltage $V_{2max}$, where $V_{2max} = V_{ccmax} * C_1/(C_1+C_2) = V_{ref}$.

In normal operation, the supply voltage $V_{cc}$ is lower than its acceptable maximum value $V_{ccmax}$. The voltage $V_2$ is thus lower than the reference voltage $V_{ref}$, and the comparator Comp provides zero voltage at the output 24 of the detection circuit 13. Since the enabling input terminal Val of the high voltage circuit 11 receives a zero voltage, the high voltage circuit 11 is inactive and provides zero voltage at its output terminal S.

Because the memory cell 12 receives zero voltage at its enabling input terminal $e_1$ and zero voltage at its high voltage input terminal $e_2$, the three transistors $T_1$, $T_2$, $T_3$ that form the memory cell are off and no information is recorded in the memory cell 12. If during operation the supply voltage $V_{cc}$ takes a value higher than its acceptable maximum value $V_{ccmax}$, the voltage $V_2$ becomes greater than the reference voltage $V_{ref}$. Then, at the output terminal 24 of the detection circuit 13, the comparator Comp provides a positive voltage (for example, $V_{cc}$).

Since the enabling input terminal Val of the high voltage circuit 11 receives a positive voltage, the high voltage circuit 11 is activated and provides a high voltage HT of sufficient amplitude (i.e., approximately 10 to 20V) to program the memory cell 12 at its output terminal S. The memory cell 12 receives a positive voltage at its enabling input terminal $e_1$, a high voltage HT at its high voltage input terminal $e_2$, and a supply voltage $V_{cc}$ at its low voltage input terminal $e_3$, resulting in the three transistors $T_1$, $T_2$, $T_3$ being saturated and information being recorded in the memory cell 12.

Numerous alternative embodiments of the circuit of FIG. 1 for detecting and recording a voltage surge may be used without departing from the scope of the present invention. For example, the transistor $T_3$ may be replaced by a diode. Further, the transistor $T_3$ may be eliminated, as it is needed only to limit the voltage applied to the drain of the storage transistor $T_2$, especially for read operations. Indeed, in FLASH EEPROM type memories, for example, a voltage of 2 to 3V applied to the drain of the storage transistor $T_2$ is enough for its contents to be read. If the supply voltage $V_{cc}$ is repeatedly applied to the drain of the storage transistor $T_2$, there is a long term risk of damaging the transistor by causing a shift in its threshold voltage.

Other detection circuits 13 may also be used. Referring to FIG. 2, a second possible embodiment of the detection circuit 13 is shown which comprises n transistors $Tr_1$ to $Tr_n$, a voltage source 14, a transistor $T_4$, and two inverters $I_1$, $I_2$. The gate and the drain of each transistor $Tr_1$ to $Tr_n$ are connected together to make diodes. The drain of the transistor $Tr_1$ is connected to the power supply source, which provides the supply voltage $V_{cc}$. The drain of each transistor $Tr_2$ to $Tr_n$ is connected to the source of the transistors $Tr_1$ to $Tr_{n-1}$, respectively. The source of the transistor $Tr_n$ is connected to the drain of the transistor $T_4$, and the source of the transistor $T_4$ is connected to ground.

The voltage source 14 provides a reference voltage $V_{ref}$ that is applied to the gate of the transistor $T_4$. The two inverters $I_1$, $I_2$, each including an input terminal and an output terminal, are series-connected. An input terminal 25 of the inverter $I_1$ is connected to the drain of the transistor $T_4$ and is at the potential $V_2 = V_{cc} - n*V_T$, where $V_T$ is the threshold voltage of the n transistors. The output terminal of the inverter $I_2$ is connected to the output terminal 24 of the detection circuit 13. At its output terminal, the inverter $I_2$ provides a steady state signal equal to logic "1" when the voltage $V_2$ is higher than the reference voltage $V_{ref}$. One potential disadvantage of the detection circuit of FIG. 2 is that it consumes more energy than the detection circuit of FIG. 1.

According to another embodiment, the configuration of FIG. 1 may be modified to include a register 26 and a capacitor 27, both of which are illustrated with dotted lines. The register 26 is connected between the output of the detection circuit 13 and the memory cell 12. The register 26 has an input terminal connected to the output terminal 24 of the detection circuit 13 and an output terminal connected to the enabling input terminal $e_1$ of the memory cell 12. The register 26 records the occurrence of a short-duration surge in the supply voltage $V_{cc}$, which is done for a period of time long enough for the memory cell 12 to be completely programmed.

The capacitor 27 is connected between the power supply voltage $V_{cc}$ and ground. In normal operation, the capacitor 27 stores power. In the event the power supply voltage $V_{cc}$ drops after the occurrence of a surge in the supply voltage $V_{cc}$, the capacitor 27 provides a power reserve to program the memory cell 12. This is a valuable improvement but requires the use of a capacitor having a high capacitance, for example, of about 300 pF.

The voltage surge detection and recording circuit according to the invention may be used to detect a surge in the supply voltage of a non-volatile memory, such as an EPROM, EEPROM, or Flash EEPROM, for example.

What is claimed is:

1. A circuit for detecting and recording a voltage surge having a value higher than a desired maximum value of a supply voltage, the circuit comprising:

a detection circuit for detecting the voltage surge and having an output for providing a control signal if the voltage surge is detected;

a high voltage circuit having a power supply input connected to the supply voltage and an enabling input connected to the detection circuit for receiving the control signal, said high voltage circuit producing a high programming voltage from the supply voltage based upon the control signal; and a memory cell having an enabling input connected to the detection circuit for receiving the control signal, a high voltage input for receiving the high programming voltage, and a low voltage input connected to the supply voltage.

2. The circuit of claim 1 wherein said detection circuit comprises:

a capacitor divider bridge to provide an additional voltage proportional to the supply voltage;

a voltage source providing a reference voltage; and a comparator having a first input receiving the additional voltage, a second input receiving the reference voltage, and providing the control signal if the additional voltage is different than the reference voltage.

3. The circuit of claim 1 wherein the detection circuit comprises:

a plurality of transistors each having a control terminal and a second conduction terminal connected together and a first conduction terminal, the second conduction terminal of one of said plurality of transistors also being connected to the supply voltage, and the second conduction terminals of others of said plurality of transistors each being connected to a first conduction terminal of an adjacent transistor;

an additional transistor having a control terminal, a second conduction terminal connected to the first conduction terminal of one of said plurality of transistors, and a first conduction terminal connected to ground;

a voltage source providing a reference voltage to the control terminal of said additional transistor; and two inverters each having an input and an output and being series-connected, the input of one of said two inverters being connected to the second conduction terminal of said additional transistor, and the output of the other of said two inverters being connected to the output of the detection circuit.

4. The circuit of claim 3 wherein said plurality of transistors comprises n transistors; and wherein n is an integer.

5. The circuit of claim 3 wherein each first conduction terminal comprises a source, each second conduction terminal comprises a drain, and each control terminal comprises a gate.

6. The circuit of claim 1, wherein said memory cell comprises:

at least one selection transistor having a control terminal, a first conduction terminal, and a second conduction terminal; and at least one storage transistor having a control terminal, a first conduction terminal, and a second conduction terminal, the control terminals of said at least one selection transistor and said at least one storage transistor being respectively connected to the enabling input of said memory cell and to the high voltage input of said memory cell, the second conduction terminal of said at least one selection transistor being connected to the low voltage input of said memory cell, the first conduction terminal of said at least one selection transistor being connected to the second conduction terminal of said at least one storage transistor, and the first conduction terminal of said at least one storage transistor being connected to ground.

7. The circuit of claim 6 wherein said memory cell comprises a transistor having a first conduction terminal, a second conduction terminal, and a control terminal; wherein the second conduction terminal and the first conduction terminal of said transistor are respectively connected to the first conduction terminal of said at least one selection transistor and to the second conduction terminal of said at least one storage transistor; and wherein the control terminal and the second conduction terminal of said transistor are connected together.

8. The circuit of claim 7 wherein each first conduction terminal comprises a source, each second conduction terminal comprises a drain, and each control terminal comprises a gate.

9. The circuit of claim 1 further comprising a register for recording an occurrence of the voltage surge, said register having an input connected to the output of said detection circuit and an output connected to the enabling input of said memory cell.

10. The circuit of claim 1 further comprising a capacitor having a first terminal connected to the supply voltage and a second terminal connected to ground.

11. A circuit for detecting and recording a voltage surge having a value higher than a desired maximum value of a supply voltage, the circuit comprising:

a detection circuit for detecting the voltage surge;

a high voltage circuit for producing a high programming voltage responsive to a detection of the voltage surge; and a memory cell connected to said detection circuit and said high voltage circuit for recording the voltage surge.

12. The circuit of claim 11 wherein said detection circuit comprises:

a capacitor divider bridge to provide an additional voltage proportional to the supply voltage;

a voltage source providing a reference voltage; and a comparator having a first input receiving the additional voltage, a second input receiving the reference voltage, and providing a control signal if the additional voltage is different than the reference voltage.

13. The circuit of claim 11 wherein the detection circuit comprises:

a plurality of transistors each having a control terminal and a second conduction terminal connected together and a first conduction terminal, the second conduction terminal of one of said plurality of transistors also being connected to the supply voltage, and the second conduction terminals of others of said plurality of transistors each being connected to a first conduction terminal of an adjacent transistor;

an additional transistor having a control terminal, a second conduction terminal connected to the first conduction terminal of one of said plurality of transistors, and a first conduction terminal connected to ground;

a voltage source providing a reference voltage to the control terminal of said additional transistor; and two inverters each having an input and an output and being series-connected, the input of one of said two inverters being connected to the second conduction terminal of said additional transistor, and the output of the other of said two inverters providing an output of the detection circuit.

14. The circuit of claim 13 wherein said plurality of transistors comprises n transistors; and wherein n is an integer.

15. The circuit of claim 13 wherein each first conduction terminal comprises a source, each second conduction terminal comprises a drain, and each control terminal comprises a gate.

16. The circuit of claim 11, wherein said memory cell has an enabling input connected to the detection circuit, a high voltage input for receiving the high programming voltage, and a low voltage input connected to the supply voltage; and wherein the memory cell further comprises:

at least one selection transistor having a control terminal, a first conduction terminal, and a second conduction terminal; and at least one storage transistor having a control terminal, a first conduction terminal, and a second conduction terminal, the control terminals of said at least one selection transistor and said at least one storage transistor being respectively connected to the enabling input of said memory cell and to the high voltage input of said memory cell, the second conduction terminal of said at least one selection transistor being connected to the low voltage input of said memory cell, the first conduction terminal of said at least one selection transistor being connected to the second conduction terminal of said at least one storage transistor, and the first conduction terminal of said at least one storage transistor being connected to ground.

17. The circuit of claim 16 wherein said memory cell comprises a transistor having a first conduction terminal, a second conduction terminal, and a control terminal; wherein the second conduction terminal and the first conduction terminal of said transistor are respectively connected to the first conduction terminal of said at least one selection transistor and to the second conduction terminal of said at least one storage transistor; and wherein the control terminal and the second conduction terminal of said transistor are connected together.

18. The circuit of claim 17 wherein each first conduction terminal comprises a source, each second conduction terminal comprises a drain, and each control terminal comprises a gate.

19. The circuit of claim 11 further comprising a register for recording the voltage surge, said register being connected between said detection circuit said memory cell.

20. The circuit of claim 11 further comprising a capacitor having a first terminal connected to the supply voltage and a second terminal connected to ground.

21. A circuit for detecting and recording a voltage surge having a value higher than a desired maximum value of a supply voltage, the circuit comprising:

a detection circuit for detecting the voltage surge and having an output for providing a control signal if the voltage surge is detected;

a high voltage circuit having a power supply input connected to the supply voltage and an enabling input connected to the detection circuit for receiving the control signal, said high voltage circuit producing a high programming voltage from the supply voltage based upon the control signal;

a memory cell having an enabling input connected to the detection circuit for receiving the control signal, a high voltage input for receiving the high programming voltage, and a low voltage input connected to the supply voltage; and a register having an input connected to the output of said detection circuit and an output connected to the enabling input of said memory cell.

22. The circuit of claim 21 wherein said detection circuit comprises:

a capacitor divider bridge to provide an additional voltage proportional to the supply voltage;

a voltage source providing a reference voltage; and a comparator having a first input receiving the additional voltage, a second input receiving the reference voltage, and providing the control signal if the additional voltage is different than the reference voltage.

23. The circuit of claim 21 wherein the detection circuit comprises:

a plurality of transistors, each having a control terminal and a second conduction terminal connected together and a first conduction terminal, the second conduction terminal of one of said plurality of transistors also being connected to the supply voltage, and the second conduction terminals of others of said plurality of transistors each being connected to a first conduction terminal of an adjacent transistor;

an additional transistor having a control terminal, a second conduction terminal connected to the first conduction terminal of one of said plurality of transistors, and a first conduction terminal connected to ground;

a voltage source providing a reference voltage to the control terminal of said additional transistor; and two inverters each having an input and an output and being series-connected, the input of one of said two inverters being connected to the second conduction terminal of said additional transistor, and the output of the other of said two inverters being connected to the output of the detection circuit.

24. The circuit of claim 23 wherein said plurality of transistors comprises n transistors; and wherein n is an integer.

25. The circuit of claim 23 wherein each first conduction terminal comprises a source, each second conduction terminal comprises a drain, and each control terminal comprises a gate.

26. The circuit of claim 21, wherein said memory cell comprises:

at least one selection transistor having a control terminal, a first conduction terminal, and a second conduction terminal; and at least one storage transistor having a control terminal, a first conduction terminal, and a second conduction terminal, the control terminals of said at least one selection transistor and said at least one storage transistor being respectively connected to the enabling input of said memory cell and to the high voltage input of said memory cell, the second conduction terminal of said at least one selection transistor being connected to the low voltage input of said memory cell, the first conduction terminal of said at least one selection transistor being connected to the second conduction terminal of said at least one storage transistor, and the first conduction terminal of said at least one storage transistor being connected to ground.

27. The circuit of claim 26 wherein said memory cell comprises a transistor having a first conduction terminal, a second conduction terminal, and a control terminal; wherein the second conduction terminal and the first conduction terminal of said transistor are respectively connected to the first conduction terminal of said at least one selection transistor and to the second conduction terminal of said at least one storage transistor; and wherein the control terminal and the second conduction terminal of said transistor are connected together.

28. The circuit of claim 27 wherein each first conduction terminal comprises a source, each second conduction terminal comprises a drain, and each control terminal comprises a gate.

29. The circuit of claim 21 further comprising a capacitor having a first terminal connected to the supply voltage and a second terminal connected to ground.

30. A method for diagnosing a defect in a device caused by voltage surge having a value higher than a desired maximum value of a supply voltage, the method comprising:

detecting the voltage surge;

producing a high programming voltage from the supply voltage in response to a detection of the voltage surge; and recording an occurrence of the voltage surge in a memory cell based upon the high programming voltage and the detection of the voltage surge.

31. The method of claim 30 further comprising providing a control signal in response to the detection of the voltage surge.

32. The method of claim 31 wherein the memory cell has an enabling input and a low voltage input; and wherein the recording comprises providing the control signal to the enabling input and providing the high programming voltage to the low voltage input.

33. The method of claim 31 wherein the detecting comprises:

providing an additional voltage proportional to the supply voltage;

providing a reference voltage;

comparing the additional voltage and the reference voltage; and providing the control signal if the additional voltage is higher than the reference voltage.

34. The method of claim 30 further comprising recording the occurrence of the voltage surge in a register prior to recording the occurrence of the voltage surge in the memory cell.

* * * * *